(12) United States Patent
Huang et al.

(10) Patent No.: US 9,423,660 B2
(45) Date of Patent: Aug. 23, 2016

(54) DISPLAY PANEL

(71) Applicant: Au Optronics Corporation, Hsinchu (TW)

(72) Inventors: Te-Chun Huang, New Taipei (TW);
Kuo-Yu Huang, Hsinchu County (TW);
Yu-Han Huang, Taipei (TW);
Maw-Song Chen, Taipei (TW);
Wei-Ming Huang, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 14/641,453

(22) Filed: Mar. 9, 2015

(65) Prior Publication Data

US 2016/0155752 A1    Jun. 2, 2016

(30) Foreign Application Priority Data

Nov. 28, 2014  (TW) .............................. 103141397 A

(51) Int. Cl.
| | |
|---|---|
| *G02F 1/1345* | (2006.01) |
| *H01L 27/12* | (2006.01) |
| *G02F 1/01* | (2006.01) |
| *G02F 1/133* | (2006.01) |
| *G02F 1/03* | (2006.01) |
| *G09G 3/36* | (2006.01) |

(52) U.S. Cl.
CPC ............ *G02F 1/1345* (2013.01); *G02F 1/0121* (2013.01); *G02F 1/133* (2013.01); *H01L 27/124* (2013.01); *G02F 1/0327* (2013.01); *G09G 3/3655* (2013.01); *G09G 3/3674* (2013.01); *G09G 3/3685* (2013.01)

(58) Field of Classification Search
CPC ..... G02F 1/0121; G02F 1/0327; G02F 1/076; G02F 1/133; G02F 1/13366; G02F 1/1345; G02F 1/13452; H01L 27/124; G09G 3/3655; G09G 3/3674; G09G 3/3685
USPC ................................................... 349/149, 152
See application file for complete search history.

(56) References Cited

U.S. PATENT DOCUMENTS

| | | | | |
|---|---|---|---|---|
| 5,521,728 | A  * | 5/1996 | Kodate .............. | G02F 1/136209 349/149 |
| 7,990,511 | B2 * | 8/2011 | Jeong .................... | G02F 1/1339 349/149 |
| 7,999,901 | B2 * | 8/2011 | Kang .................... | G02F 1/1345 345/104 |
| 8,045,123 | B2 * | 10/2011 | Kawamura ........ | G02F 1/134363 349/148 |

(Continued)

FOREIGN PATENT DOCUMENTS

| | | |
|---|---|---|
| CN | 101604503 | 12/2009 |
| CN | 102629053 | 8/2012 |

(Continued)

*Primary Examiner* — Anne Hines
*Assistant Examiner* — Jose M Diaz
(74) *Attorney, Agent, or Firm* — Jianq Chyun IP Office

(57) ABSTRACT

A display panel is provided. The display panel has a display area and a peripheral area and includes a plurality of pixels, a plurality of data lines and a plurality of signal traces. The pixels are disposed on the display area and arranged in an array. The data lines extend from the display area to the peripheral area and are respectively electrically connected to a plurality of columns of pixel. The signal traces extend from the display area to the peripheral area and are parallel to the data lines. In addition, the data lines and the signal traces are respectively disposed between two columns of pixels, and the signal traces include a plurality of gate signal traces.

8 Claims, 4 Drawing Sheets

(56) References Cited

U.S. PATENT DOCUMENTS

| | | | |
|---|---|---|---|
| 8,405,646 B2 | 3/2013 | Lo et al. | |
| 8,427,412 B2 | 4/2013 | Wang et al. | |
| 8,542,161 B2 | 9/2013 | Chiang et al. | |
| 9,024,921 B2 * | 5/2015 | Kang | H01L 51/5259 257/59 |
| 9,324,764 B2 | 4/2016 | Wang et al. | |
| 2009/0040408 A1 | 2/2009 | Ishii | |
| 2010/0171687 A1 * | 7/2010 | Chiang | G09G 3/3648 345/98 |
| 2010/0188378 A1 * | 7/2010 | Chiang | G09G 3/3648 345/206 |
| 2013/0141660 A1 | 6/2013 | Wang et al. | |
| 2015/0123081 A1 * | 5/2015 | Huang | H01L 27/3279 257/40 |
| 2016/0020223 A1 * | 1/2016 | Liao | H01L 27/1255 257/72 |
| 2016/0064411 A1 * | 3/2016 | Park | H01L 27/156 257/89 |

FOREIGN PATENT DOCUMENTS

| | | |
|---|---|---|
| JP | 2001174842 | 6/2001 |
| TW | 201411254 | 3/2014 |

* cited by examiner

US 9,423,660 B2

DISPLAY PANEL

CROSS-REFERENCE TO RELATED APPLICATION

This application claims the priority benefit of Taiwan application serial no. 103141397, filed on Nov. 28, 2014. The entirety of the above-mentioned patent application is hereby incorporated by reference herein and made a part of this specification.

BACKGROUND OF THE INVENTION

1. Field of the Invention

The invention relates to a display panel, and particularly relates to a display panel having an active device.

2. Description of Related Art

Among all the structures of the pixel array of the conventional LCD panel, one type of the structures is called the half source driving (HSD) structure. By reducing half of the data lines, half of the source drivers used are also reduced in the HSD structure. Thus, the cost of display panels is significantly reduced. To further reduce the manufacture cost, another type pixel array structures, namely the one third source driving (OTSD) structure, is proposed. In the OTSD structure, the number of data lines is further reduced to one third of the number of the original structure. Therefore the manufacturing cost is further reduced.

SUMMARY OF THE INVENTION

A display panel has a display area and a peripheral area, the display panel includes a plurality of pixels, a plurality of data lines, a plurality of gate lines, and a plurality of signal traces. The pixels are disposed in the display area and arranged in an array. The data lines extend from the display area to the peripheral area to be electrically connected to a driver. In addition, the data lines are respectively electrically connected to a plurality of columns of pixels. The gate lines are disposed in the display area and perpendicular to the data lines. The signal traces extend from the display area to the peripheral area and parallel to the data lines. Moreover, the data lines and the signal traces are respectively disposed between two columns of pixels, and the signal traces include a plurality of gate signal traces respectively electrically connected to the corresponding gate line.

To make the above features and advantages of the invention more comprehensible, embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
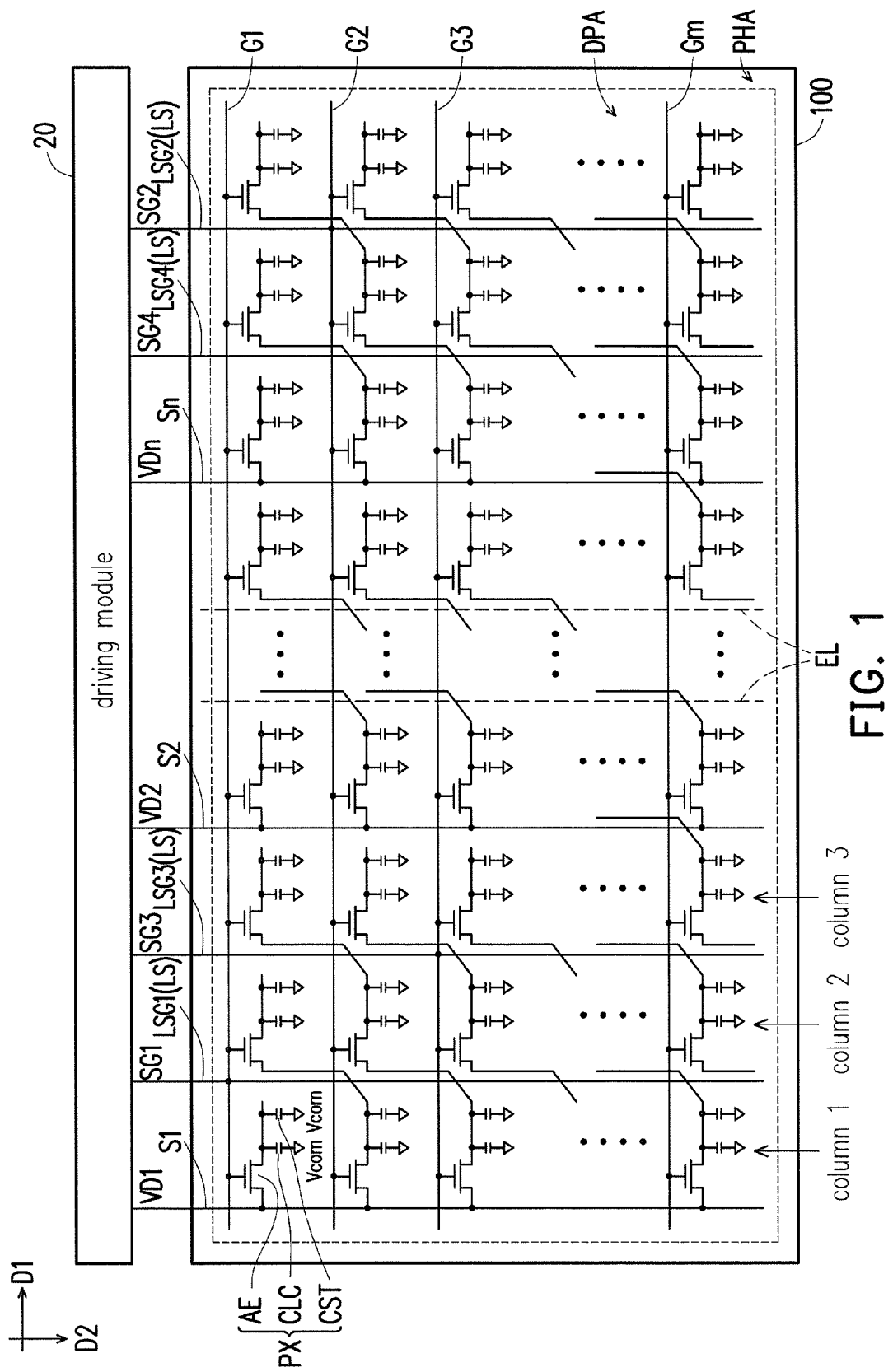
FIG. 1 is a schematic view illustrating a circuit of a display panel according to a first embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic view illustrating a circuit of a display panel according to a first embodiment of the invention. Referring to FIG. 1, in this embodiment, a display panel 100 has a display area DPA and a peripheral area PHA. In addition, the display panel 100 includes a plurality of pixels PX, a plurality of data lines (e.g., S1 to Sn), a plurality of gate lines (e.g., G1 to Gm), and a plurality of signal traces LS (e.g., gate signal traces LSG1 to LSGm, FIG. 1 only shows LSG1 to LSG4 for an illustrative purpose). In addition, n and m are respectively positive integers.

The pixels PX are disposed in the display area DPA, and are arranged in an array. The data lines S1 to Sn extend from the display area DPA to the peripheral area PHA, so as to be electrically connected to a driving module 20 to receive data voltages VD1 to VDn. In addition, the data lines S1 to Sn are respectively electrically connected to a plurality of columns (e.g., three columns, as shown herein) of the pixels PX. The driving module 20 may be regarded as a source driver. The gate signal traces LSG1 to LSGm extends from the display area DPA to the peripheral area PHA, and are parallel to the data lines S1 to Sn. In addition, the data lines S1 to Sn and the gate signal traces LSG1 to LSGm are sequentially arranged along a first direction D1. The gate lines G1 to Gm are disposed in the display area DPA and perpendicular to the data lines S1 to Sn. Namely, the gate lines G1 to Gm are sequentially arranged along a second direction D2.

In this embodiment, the data lines S2 to Sn and the gate signal traces LSG1 to LSGm are respectively disposed between two pixels. Namely, distances between the data lines S1 to Sn and the gate signal traces LSG1 to LSGm are integral multiples of a pixel interval. Also, in some of the areas between two columns of the pixels, as indicated by dotted lines EL, there is no wiring disposed. Namely, there is no other wiring between each two columns of the pixels except the data lines S2 to Sn and the gate signal traces LSG1 to LSGm.

In this embodiment, the gate signal traces LSG1 to LSGm are respectively electrically connected to the corresponding gate lines G1 to Gm and the driving module 20, so as to transmit corresponding gate signals (e.g., SG1 to SG4) to the corresponding gate lines G1 to Gm. At this time, with respect to the gate lines G1 to GM, the driving module 20 may be regarded as a gate driver. Namely, the driving module 20 may be regarded as a combination of the source driver and the gate driver, so as to reduce circuits or wiring at sides of the display panel 100 and thus provide an effect of slim boarder.

In this embodiment, the gate signal traces (e.g., LSG1 and LSG3) that are electrically connected to the odd gate lines (e.g., G1 and G3) of the gate lines (e.g., G1 to Gm) are sequentially arranged from a first side (e.g., the left side of the drawing) of the display area DPA toward the center of the display panel 100, and the gate signal traces (e.g., LSG2 and LSG4) that are electrically connected to the even gate lines (e.g., G2 to G4) of the gate lines (e.g., G1 to Gm) are sequentially arranged from a second side (e.g., the right side of the drawing) of the display area DPA toward the center of the display panel 100. In addition, the first side and the second side are opposite sides of the display panel 100.

In this embodiment, each of the pixels PX includes an active device AE (exemplified as a transistor here), a liquid crystal capacitor CLC, and a storage capacitor CST. A control end of the active device AE is electrically connected to the corresponding gate line (e.g., G1 to Gm), a first end of the active device AE is connected to the corresponding data line (e.g., S1 to Sn) or is connected to the corresponding data line (e.g., S1 to Sn) through other active device AE. The liquid crystal capacitor CLC and the storage capacitor CST are electrically connected between a second end of the active device AE and a common voltage Vcom.

More specifically, for the pixels PX in three columns (e.g., columns 1 to 3 in the drawing) that are electrically connected to the same data line (e.g., S1 to Sn), the active devices AE of the pixels PX are cascaded along the first direction D1 perpendicular to the data lines S1 to Sn. Namely, the first ends of the active devices AE of the pixels PX in the column 1 are connected to the corresponding data line (e.g., S1 to Sn), the first ends of the active devices AE of the pixels PX in the column 2 are connected to the second ends of the active devices AE of the pixels PX in the column 1, and the first ends of the active devices AE of the pixels PX in the column 3 are electrically connected to the second ends of the active devices AE of the pixels PX in the column 2. In addition, the control ends of the cascaded active devices AE may be respectively electrically connected to different and adjacent gate lines (e.g., G1 to Gm). For example, the pixels PX in the column 1 are cascaded to the pixels PX in the above two rows. In addition, the cascaded pixels PX may correspond to different colors.

Figure 2:
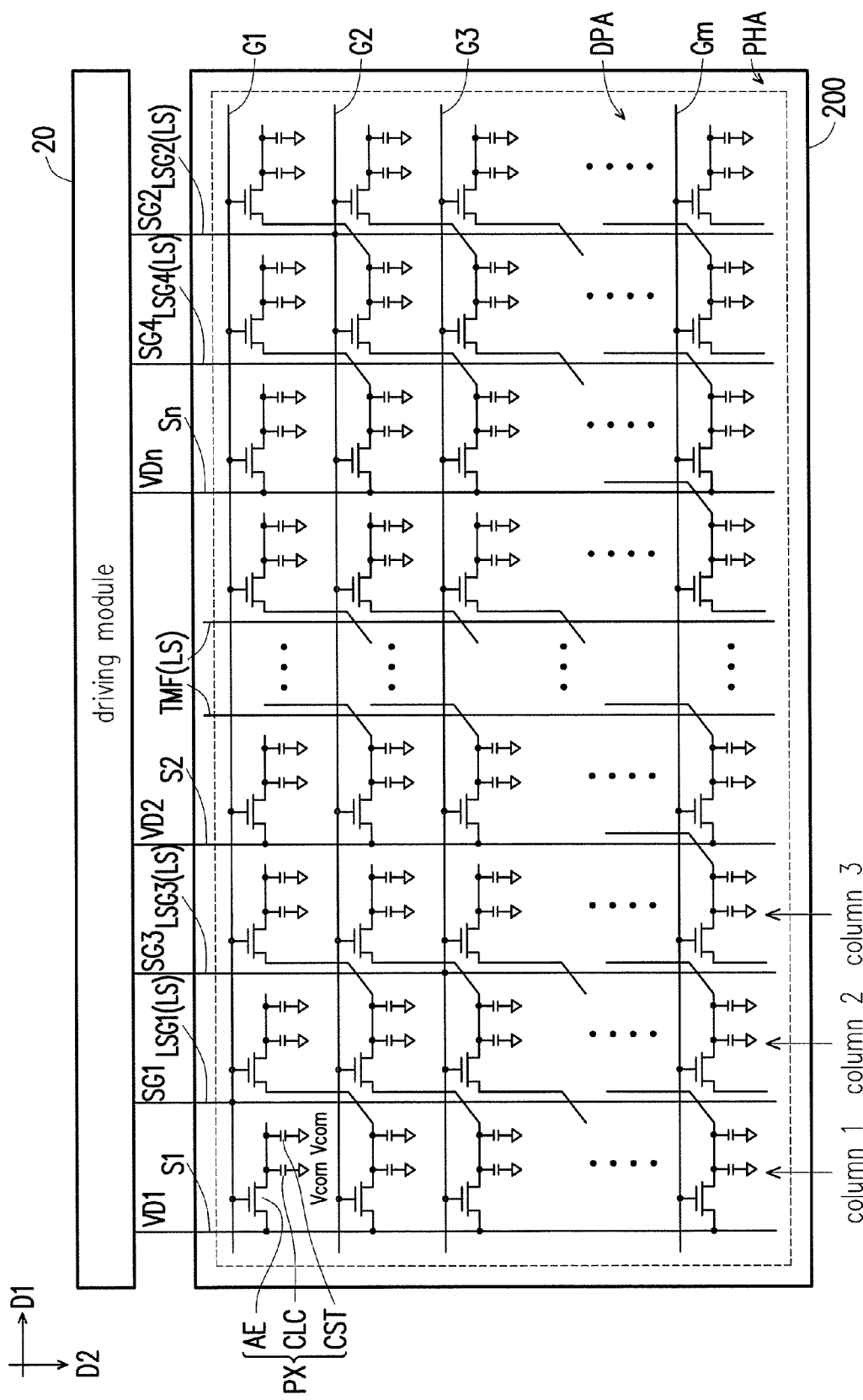
FIG. 2 is a schematic view illustrating a circuit of a display panel according to a second embodiment of the invention.

FIG. 2 is a schematic view illustrating a circuit of a display panel according to a second embodiment of the invention. Referring to FIGS. 1 and 2, a display panel 200 is mostly similar to the display panel 100 but differs in that the signal traces LS of the display panel 200 further include a plurality of floated metal wires TMF. The floated metal wires TMF extend from the display area DPA to the peripheral area PHA. In addition, the data lines S2 to Sn, the gate signal traces LSG1 to LSGm, and the floated metal wires TMF are respectively disposed between two columns of pixels. Here, like or similar components are referred to by like or similar reference numerals. Since positions of the floated metal wires TMF in the embodiment of the invention are the same as conventional positions of the data lines, a photomask of the display panel 200 may be modified easily. Thus, the difficulty of adjusting a manufacturing process of the display panel 200 is reduced.

Figure 3:
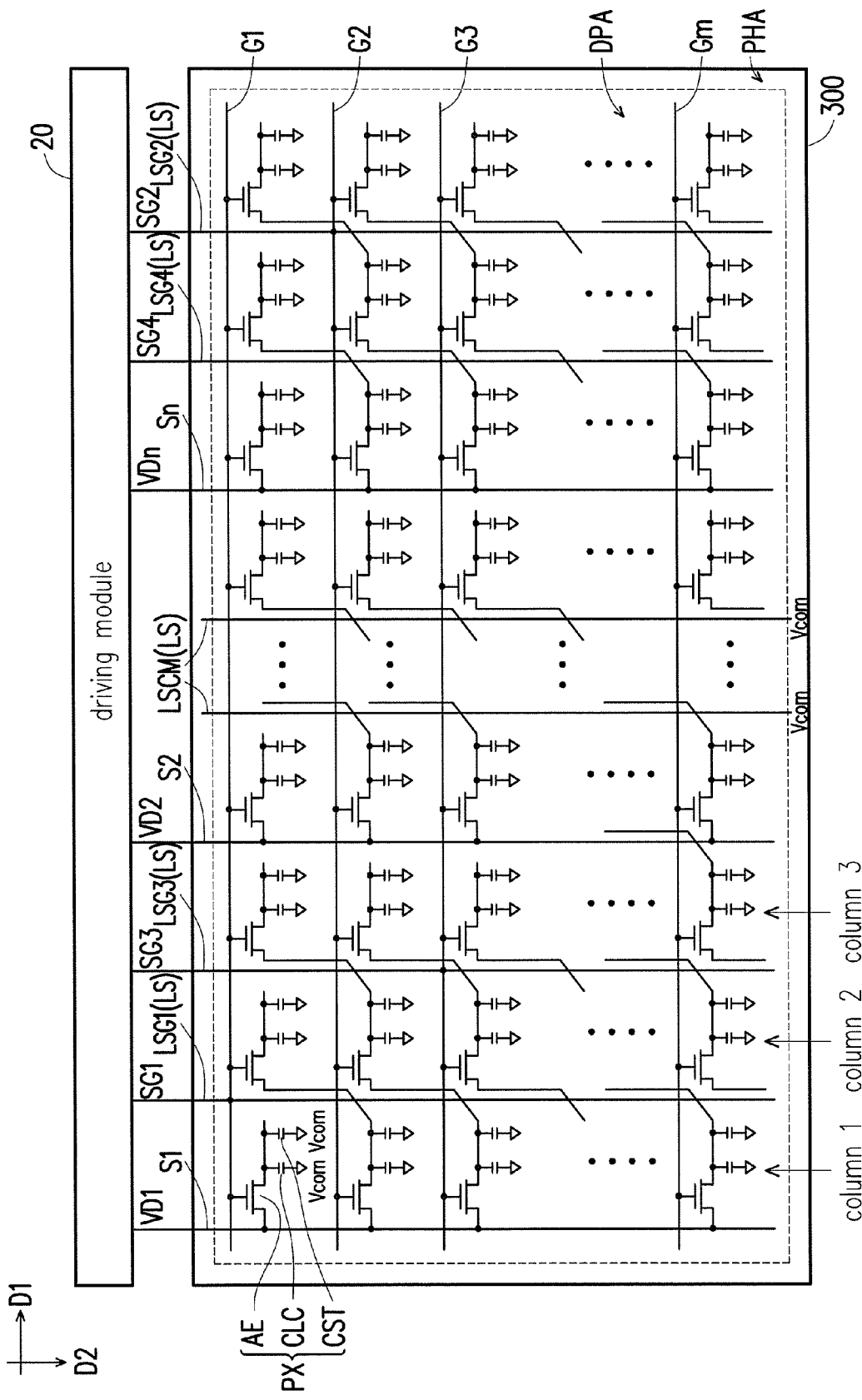
FIG. 3 is a schematic view illustrating a circuit of a display panel according to a third embodiment of the invention.

FIG. 3 is a schematic view illustrating a circuit of a display panel according to a third embodiment of the invention. Referring to FIGS. 1 and 3, a display panel 300 is mostly similar to the display panel 100, but differs in that the signal traces LS of the display panel 300 further include a plurality of common voltage lines LSCM. In addition, the data lines S2 to Sn, the gate signal traces LSG1 to LSGm, and the common voltage lines LSCM are respectively disposed between two columns of pixels. Here, like or similar components are referred to by like or similar reference numerals. In this embodiment, the common voltage lines LSCM receive the common voltage Vcom, so as to transmit the common voltage Vcom to each of the pixels PX.

Figure 4:
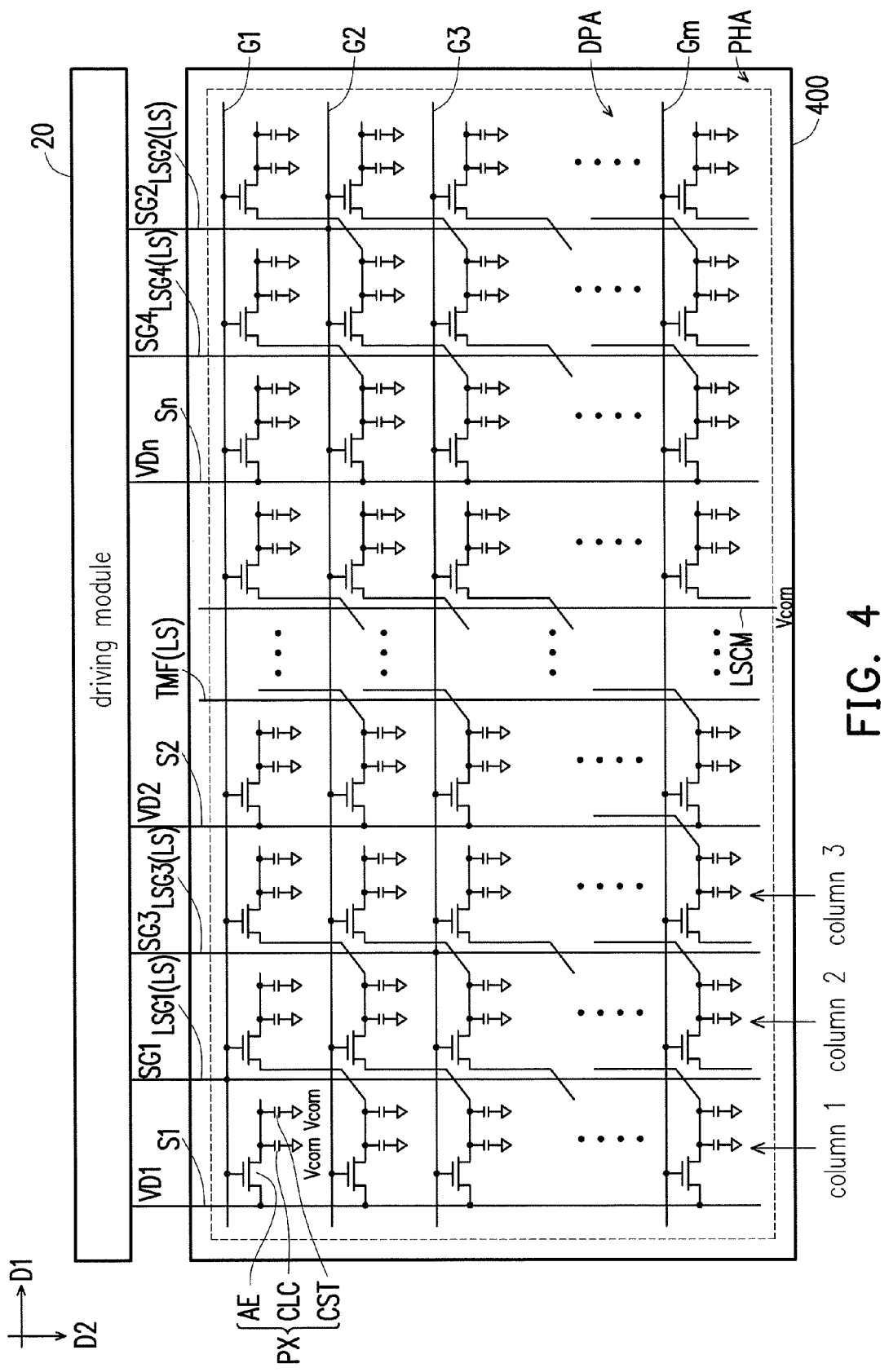
FIG. 4 is a schematic view illustrating a circuit of a display panel according to a fourth embodiment of the invention.

FIG. 4 is a schematic view illustrating a circuit of a display panel according to a fourth embodiment of the invention. Referring to FIGS. 2 to 4, a display panel 400 is mostly similar to the display panel 100, but differs in that the signal traces LS of the display panel 400 include the gate signal traces LS1 to LSGm, the common voltage lines LSCM (shown with one common voltage line LSCM for an illustrative purpose only), and the floated metal wires TMF (shown with one floated metal wire TMF for an illustrative purpose only). In addition, the data lines S2 to Sn, the gate signal traces LSG1 to LSGm, the common voltage lines LSCM, and the floated metal wires TMF are respectively disposed between two columns of pixels. Here, like or similar components are referred to by the same or similar reference numerals.

According to the above, in the display panel of the embodiments of the invention, a one third source driving (OTSD) structure is used to reduce the number of data lines used. In addition, space obtained from reduction of the data lines is used to dispose signal traces, so as to transmit the gate signal and/or the common voltage through the signal traces LS. In this way, the slim border can be designed. In addition, by using the floated metal wires, the distance between pixels and line remains the same as in the conventional photomask. Thus, the manufacturing difficulty of the display panel is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A display panel, having a display area and a peripheral area, the display panel comprising:
   a plurality of pixels, disposed in the display area and arranged in an array;
   a plurality of data lines, extending from the display area to the peripheral area to be electrically connected to a source driver, wherein the data lines are respectively electrically connected to a plurality of columns of pixels;
   a plurality of gate lines, disposed in the display area and perpendicular to the data lines; and
   a plurality of signal traces, extending from the display area to the peripheral area and parallel to the data lines,
   wherein the data lines and the signal traces are respectively disposed between two columns of pixels, and the signal traces comprise a plurality of gate signal traces respectively electrically connected to the corresponding gate lines; wherein the gate signal traces electrically connected to a plurality of odd gate lines of the gate lines are sequentially arranged from a first side of the display area to the center of the display panel, the gate signal traces electrically connected to a plurality of even gate lines of the gate lines are sequentially arranged from a second side of the display area to the center of the display panel, and the first side and the second side are opposite sides of the display panel.

2. The display panel as claimed in claim 1, wherein the signal traces further comprise a plurality of floated metal wires.

3. The display panel as claimed in claim 1, wherein the signal traces further comprise a plurality of common voltage lines.

4. The display panel as claimed in claim 1, wherein the signal traces further comprise a plurality of floated metal wires and a plurality of common voltage lines.

5. The display panel as claimed in claim 1, wherein a plurality of active devices of the pixels are cascaded along a first direction perpendicular to the data lines to be electrically connected to the corresponding data lines.

6. The display panel as claimed in claim 5, wherein control ends of the cascaded active devices are respectively electrically connected to different gate lines.

7. The display panel as claimed in claim 6, wherein the control ends of the cascaded active devices are electrically connected to the adjacent gate lines.

8. The display panel as claimed in claim 5, wherein the cascaded pixels correspond to different colors.

* * * * *